United States Patent
Kitayama et al.

(10) Patent No.: US 7,834,542 B2
(45) Date of Patent: Nov. 16, 2010

(54) ORGANIC LIGHT-EMITTING APPARATUS

(75) Inventors: Hiroyuki Kitayama, Isehara (JP); Yoichi Osato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 559 days.

(21) Appl. No.: 11/847,692

(22) Filed: Aug. 30, 2007

(65) Prior Publication Data

US 2008/0074859 A1    Mar. 27, 2008

(30) Foreign Application Priority Data

Sep. 26, 2006 (JP) .............................. 2006-260133
Aug. 24, 2007 (JP) .............................. 2007-218190

(51) Int. Cl.
*H01J 1/62* (2006.01)
(52) U.S. Cl. ........................ 313/504; 313/112; 313/498
(58) Field of Classification Search ......... 313/498–512, 313/112
See application file for complete search history.

(56) References Cited

U.S. PATENT DOCUMENTS

| | | | |
|---|---|---|---|
| 2002/0000772 A1 | 1/2002 | Kitahara | 313/503 |
| 2005/0007793 A1 | 1/2005 | Yoshida et al. | 362/558 |
| 2007/0230158 A1 | 10/2007 | Kitayama et al. | 362/84 |
| 2007/0230211 A1 | 10/2007 | Osato et al. | 362/600 |

FOREIGN PATENT DOCUMENTS

| | | |
|---|---|---|
| JP | 11-097169 | 4/1999 |
| JP | 2002-006776 | 1/2002 |
| JP | 2005-055481 | 3/2005 |

*Primary Examiner*—Joseph L Williams
(74) *Attorney, Agent, or Firm*—Fitzpatrick, Cella, Harper & Scinto

(57) ABSTRACT

There is provided an organic light-emitting apparatus in which the luminance can be improved, and, at the same time, the reflection of ambient light can be reduced by adding a prism member and a light-absorbing member to a spontaneous light-emitting device such as an organic light-emitting device, and which includes: a plurality of organic light-emitting devices each having a pair of electrodes and an organic compound layer formed between the pair of electrodes; a prism member disposed on a light extraction side of the organic light-emitting device, an interface on the light extraction side of the prism member being an interface with air; and a light-absorbing member formed between the plurality of organic light-emitting devices, around the prism member, and on a side portion of a protrusion of the prism member.

12 Claims, 4 Drawing Sheets

ORGANIC LIGHT-EMITTING APPARATUS

BACKGROUND OF THE INVENTION

1. Field of the Invention

The present invention relates to an organic light-emitting apparatus having a plurality of organic light-emitting devices.

2. Description of the Related Art

Light from a spontaneous light-emitting device such as an organic light-emitting device (organic EL device, hereinafter sometimes simply referred to as "device") is totally reflected at, for example, an interface between a substrate of the device and air when the light is incident on the interface at an angle larger than a critical angle. Therefore, there is a problem that only about 20% of the entire emitted light can be actually extracted to the outside of the device. In view of the foregoing, a number of proposals have been made, in which light-extraction efficiency is improved by providing a light extraction surface of a device with, for example, an uneven member.

Japanese Patent No. 3,543,951 discloses a conventional technology for improving the luminance of an organic light-emitting apparatus. The technology disclosed in the patent document is to provide an image display apparatus which can improve luminance when viewed from the front of a display surface. The document discloses, as a means for overcoming the problem, a constitution example in which a prism sheet having a plurality of prism surfaces formed thereon is provided for each of emission surfaces divided in order that lights from respective display devices may not interfere with each other.

Further, Japanese Patent Application Laid-Open No. 2005-055481 discloses, with a view to attain an effect of sufficiently improving the luminance, a constitution example in which a prism sheet is provided on an organic EL panel having a light source of a spontaneous emission type.

However, the conventional organic light-emitting apparatus having a prism sheet has been of a constitution insufficient to display a high-definition image with less reflection of ambient light. Moreover, a constitution which suppresses the reflection of ambient light by utilizing a circularly polarizing plate has been disclosed, but there has been no description concerning the extent to which the reflection of ambient light has been prevented, so that the constitution has been unsatisfactory.

SUMMARY OF THE INVENTION

The present invention provides an organic light-emitting apparatus in which a prism member and a light-absorbing member are disposed corresponding to a pixel shape on a light extraction surface of an organic light-emitting device and which can realize reduction in reflection of ambient light and improvement in luminance.

According to a first aspect of the present invention, there is provided, as a means for solving the above-mentioned problems of the prior art, an organic light-emitting apparatus including: a plurality of organic light-emitting devices each having a pair of electrodes and an organic compound layer formed between the pair of electrodes; a prism member disposed on a light extraction side of the organic light-emitting device, an interface on the light extraction side of the prism member being an interface with air; and a light-absorbing member formed between the plurality of organic light-emitting devices, around the prism member, and on a side portion of a protrusion of the prism member.

According to the present invention, there can be provided an organic light-emitting apparatus in which the reflection of ambient light is reduced and the efficiency of extraction of light from a light-emitting pixel is improved.

Further features of the present invention will become apparent from the following description of exemplary embodiments with reference to the attached drawings.

DESCRIPTION OF THE EMBODIMENTS

Figure 1A:
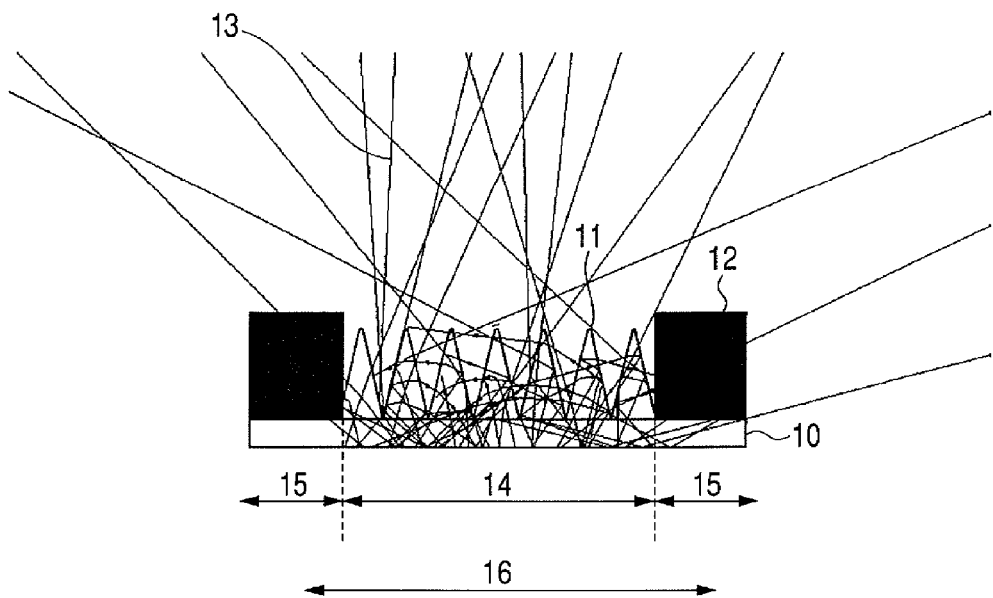
FIG. 1A is a schematic diagram illustrating propagation of EL light emitted from an organic light-emitting apparatus according to the present invention.

The organic light-emitting apparatus according to the present invention has a plurality of organic light-emitting devices and a prism member disposed on a light extraction side of the organic light-emitting devices. The plurality of organic light-emitting devices are formed distant from each other, and are each adapted to serve as a light-emitting device under control.

Each of the organic light-emitting devices has at least a pair of electrodes and an organic compound layer formed between the pair of electrodes. One of the pair of electrodes is a cathode (cathode electrode), and the other is an anode (anode electrode). Flowing a current between the electrodes causes the organic compound layer formed between the electrodes to emit light. The organic compound layer has at least a light-emitting layer, and an electron-transporting layer or a hole-transporting layer may also be formed as a carrier-transporting layer in the organic compound layer. In addition, an electron injection layer or a hole injection layer may be formed as a carrier injection layer between the carrier-transporting layer and one of the electrodes.

Further, the prism member is provided to reduce the total reflection of light emitted from the organic light-emitting layer at an interface with an external environment (air). Therefore, the interface on the light extraction side of the prism member is an interface with the external environment (air). The angle at which light is incident on the interface with the external environment (incident angle) can be made small as compared to that in the case of a conventional constitution in which the interface with the external environment is formed to be flat, so that the total amount of light that can be extracted to the outside increases.

Moreover, the organic light-emitting device of the present invention further has a light-absorbing member. The light-absorbing member is provided to prevent light which is incident from the outside on the organic light-emitting apparatus from going outside again. The light-absorbing member is provided in a region (inter-device region) between a plurality of organic light-emitting devices and around the prism member in-plane direction of the light-emitting apparatus. In addition, the light-absorbing member is provided on a side portion of a protrusion of the prism member. Light which is incident on the prism member from the outside is repeatedly reflected and refracted a plurality of times in the prism member to be finally turned into light travelling in-plane direction of the light-emitting apparatus, and is then incident on the light-absorbing member provided on the side portion of the protrusion to be absorbed there. Therefore, light which is incident on the apparatus never goes out of the device again, so that good light emission can be obtained. In addition, light which is directly incident on the light-absorbing member from the outside is absorbed by the light-absorbing member and does not go outside again, so that good light emission can be obtained.

An embodiment of the organic light-emitting apparatus according to the present invention will be described with reference to the attached drawings.

Figure 1B:
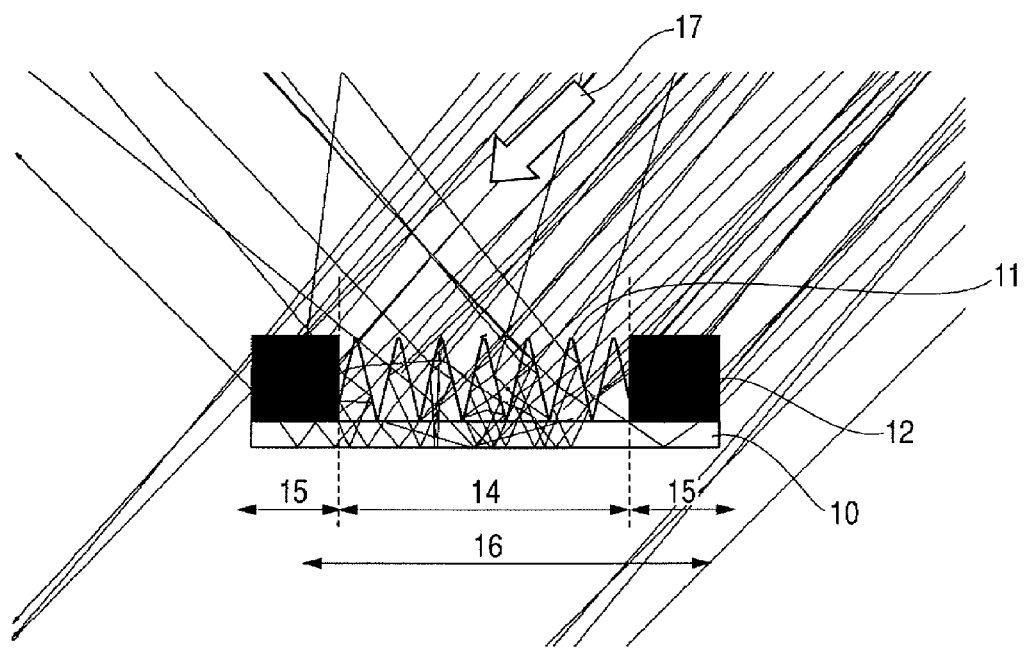
FIG. 1B is a schematic diagram illustrating propagation of ambient light incident on an organic light-emitting apparatus according to the present invention.

As shown in FIGS. 1A and 1B, the organic light-emitting apparatus has a prism member 11 and a light-absorbing member 12 on the light extraction surface of an organic light-emitting device 10. The prism member 11 is disposed at a location corresponding to (location substantially just over) a light-emitting pixel portion 14 of the organic light-emitting device 10. Further, the light-absorbing member 12 is disposed at a location corresponding to (location substantially just over) a non-light-emitting portion 15 of the organic light-emitting device 10.

Light (EL light) 13 emitted from the organic light-emitting device 10 transmit through the prism member 11 disposed on the light extraction surface to be extracted in an observation direction (see FIG. 1A). The light extraction efficiency of this system is increased to 30 to 35% as compared to that in the case where the light extraction surface is flat, that is, 20% or less, by an effect of the prism member 11 as to be described later.

On the other hand, ambient light 17 which is incident from the outside of the organic light-emitting apparatus are reflected by the surface of the prism member 11, or transmit through the prism member 11 thereinto (see FIG. 1B). A part of the ambient light 17 is further repeatedly reflected by, or caused to transmit through the prism member 11 a plurality of times. After the repetition of such steps, the light is turned into light having a component travelling in a relatively horizontal direction, and is then effectively absorbed by the light-absorbing member 12 disposed at the location corresponding to the non-light-emitting portion 15.

Figure 4:
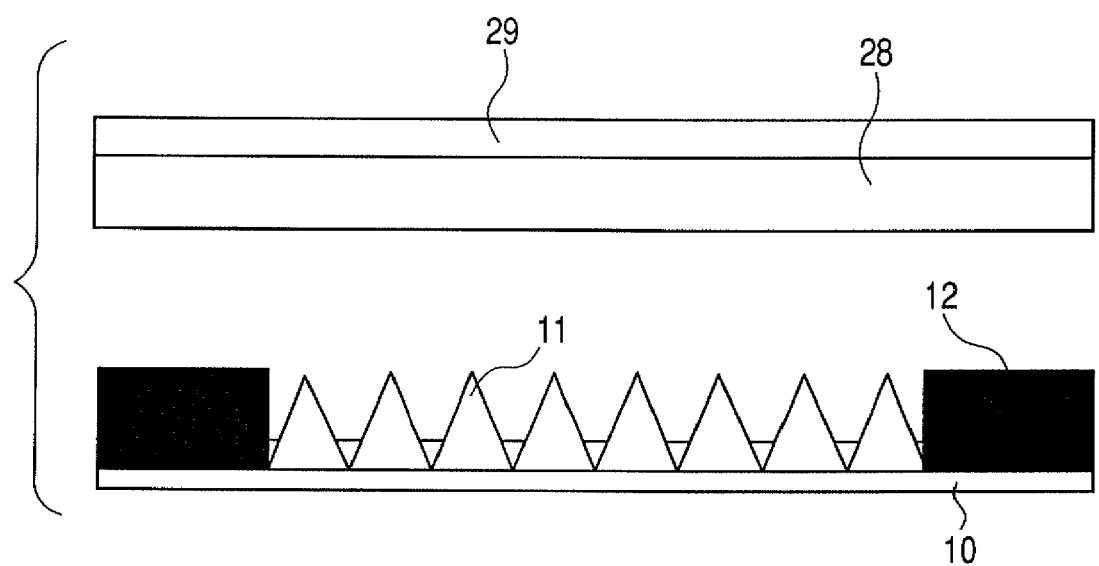
FIG. 4 is a schematic view illustrating another example of the configuration of an organic light-emitting apparatus according to the present invention.

Further, FIG. 4 shows an example of another embodiment of the present invention. In this example, a transparent substrate 28 and a circularly polarizing member 29 are disposed on the organic light-emitting apparatus shown in FIGS. 1A and 1B with a gap therebetween. The configuration shown in FIG. 4 is effective when a sufficient effect of preventing the reflection of ambient light cannot be obtained with the configuration shown in FIGS. 1A and 1B. In the figure, the circularly polarizing member 29 is disposed on an observer side. Alternatively, the transparent substrate and the circularly polarizing plate may be stacked in the mentioned order from the observer side.

As described above, the constitution of the present invention can simultaneously achieve the two objects of the improvement in efficiency of extraction of the EL light 13 and the reduction of reflection of ambient light.

Hereinafter, a specific configuration of the above-mentioned organic light-emitting apparatus will be described.

Figure 2:
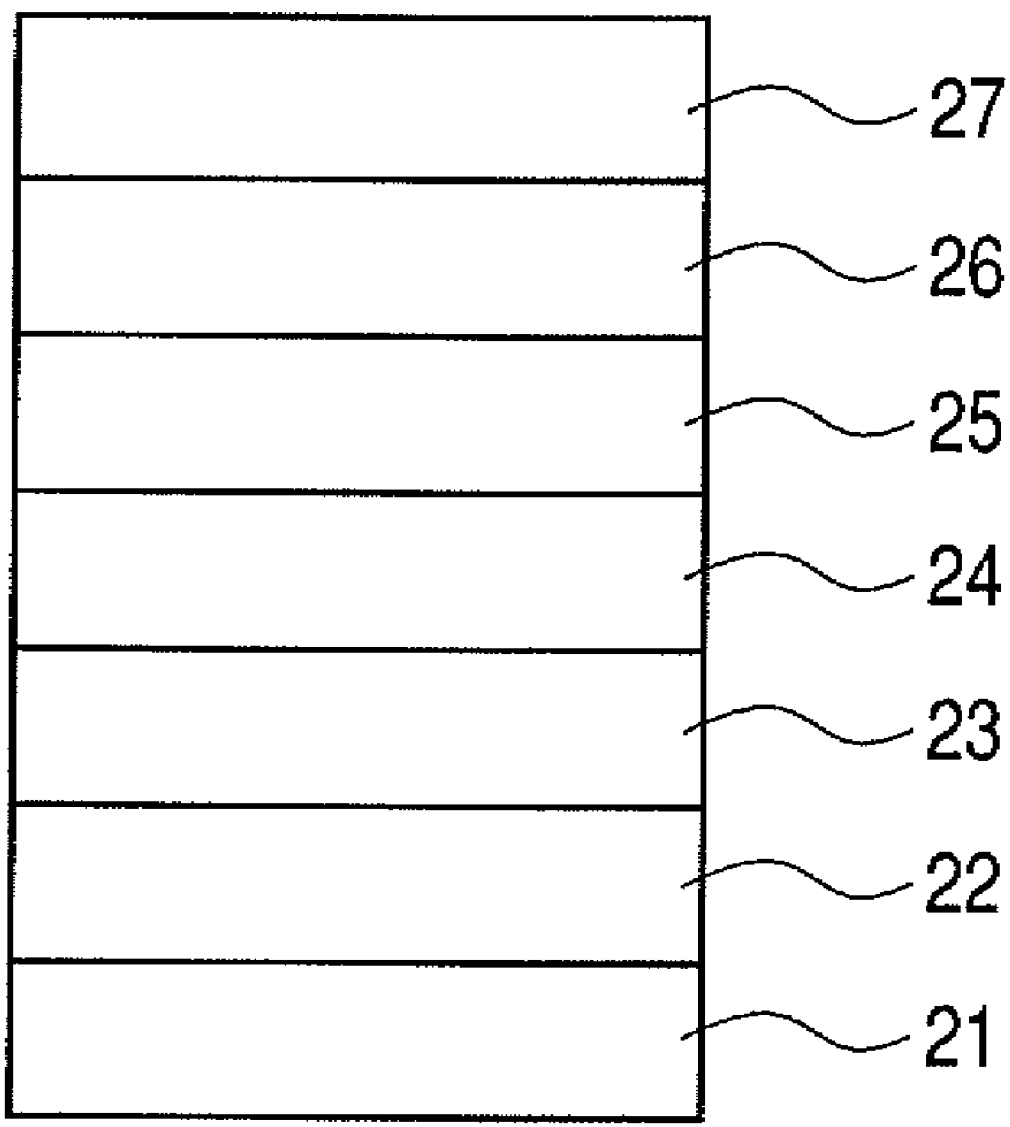
FIG. 2 is a schematic cross-sectional view illustrating an example of a configuration of an organic light-emitting device.

As the organic light-emitting device 10, any known device configuration and device material can appropriately be utilized (see FIG. 2). The configuration of the organic light-emitting device 10 will be described in association with production steps.

The organic light-emitting device 10 according to the present embodiment is of a top emission structure, and, firstly, organic compound layers are formed by a vacuum vapor deposition method on a substrate 21 having a driver circuit or the like provided thereon in advance.

On the substrate 21, an anode electrode 22 made of Cr and having a thickness of 50 nm and a width of 100 μm is formed in a two-dimensional pattern at a pitch of 200 μm in advance. As the material of the anode electrode 22, any other material having a high reflectance such as Al, Ag, or an alloy may be used, and a transparent conductive film made of, for example, ITO or IZO may be stacked on the anode electrode in order that hole injection property may be improved.

On the substrate obtained in the above steps, α-NPD is deposited in a thickness of 20 nm as a hole-transporting layer 23 made of an organic EL material. Next, Alq3 is deposited thereon in a thickness of 30 nm to serve as a light-emitting layer 24 as an organic EL material. Further, a film of a mixture of cesium carbonate and Alq3 having a thickness of 50 nm is formed to serve as an electron injection layer 25.

Then, an ITO film having a thickness of 60 nm is formed by a sputtering method as a cathode electrode 26 on the electron injection layer 25.

A SiN film having a thickness of 640 nm is formed by a sputtering method as a protective layer 27 on the cathode electrode 26 for preventing moisture from intruding into the organic compound layers from the outside, whereby the organic light-emitting device is produced. The organic light-emitting device is of such a configuration that EL emission occurs at an interface between the hole-transporting layer 23 and the light-emitting layer 24.

The protective layer 27 is preferably provided between the prism member and the cathode electrode 26 rather than on the light extraction side of the prism member. This is because, when the protective layer is provided on the light extraction side of the prism member, there are posed the problems such that the coverage performance is degraded by the unevenness and that light reflection occurs at an interface between the protective layer and the external environment.

The protective layer 27 is preferably made of a material which oxygen, moisture, or the like hardly permeates. For example, Japanese Patent Application Laid-Open No. H11-097169 discloses that a film made of an oxide, nitride, or sulfide material containing silicon, boron, germanium, or the like as a main component is suitable for a protective layer. The effect of blocking oxygen, moisture, or the like can be obtained when the thickness of the layer is about 300 nm to 10 μm. The thickness is preferably about 300 nm to 5 μm in consideration of a reduction of a film stress, and shortening of the film formation time period to improve the productivity. In addition, the protective layer 27 is preferably transparent when light emitted from the organic compound layer is extracted through the protective layer.

The prism member 11 is an optically transparent member having a plurality of protrusions provided on the side thereof (upper surface side in this embodiment) opposite to the surface thereof which in contact with the light extraction surface of the organic light-emitting device 10. The protrusion preferably has a pyramid shape, a prismoid (truncated pyramid) shape, or a triangle pole shape (prism shape). The term "prism member" herein employed includes not only a member of such a shape that a plurality of triangle-pole-shaped protrusions are disposed parallel to each other (prism shape) but also a member of such a shape that a plurality of pyramid-shaped protrusions are disposed parallel to each other and a member of such a shape that a plurality of prismoid-shaped protrusions are disposed parallel to each other.

A prism member having a pyramid shape (quadrangular pyramid shape) is expected to have a large light condensing effect in a light extraction direction. Further, the prism member with such a shape has surfaces inclined in various directions and is therefore expected to exhibit an effect of reducing the reflection of ambient light (in particular, an effect of reducing regular reflection peaks).

Further, a prism member having a prism shape (triangle pole shape) can also be used. A prism member having a prism shape has been already put into commercial use for a film for increasing the luminance of backlight and therefore has an advantage of being available at low cost.

Cones or triangle poles are arranged with the height and the shape of the bottom surface of each protrusion being optimized such that the inclination of each protrusion has an angle close to a predetermined angle. Each protrusion is set to have a base of about 1 μm to 100 μm, and a height of about 0.1 μm to 200 μm. The shape of each protrusion is selected in such a manner that the inclination angle is such that the apex angle of a cone or triangle pole is about 30° to 160°.

In order that a sheet of a prism member is not tinted by the influence of diffraction due to the shape of protrusions, a pitch size of 1 μm or more is preferable. Moreover, in order that a user does not feel the blurring of an image upon observation of a panel of a produced apparatus, a pitch size not exceeding a pixel pitch is preferable.

To produce the sheet, a protrusion pattern is formed using a transparent sheet. As a sheet material, polymethylmethacrylate (PMMA), polycarbonate (PC), cellulose triacetate (TAC), glass, or the like can be used. Those materials have refractive indexes of 1.49 to 1.57, which are substantially equal to each other.

The formation of protrusions is performed by firstly forming a protrusion pattern of a resist by employing a photolithography technique and then making a recessed die by transferring the pattern by employing an electroforming technique. Next, the above-mentioned transparent sheet is subjected to thermal compression molding using the recessed die, whereby a protrusion pattern is obtained. Alternatively, a protrusion pattern may be formed by transferring a protrusion pattern onto a sheet using a photocurable resin and then curing the photocurable resin with ultraviolet light.

In the production of a sheet with a triangle pole shaped protrusion pattern used as, for example, a film for increasing the luminance of a backlight for liquid crystal, there are cases where a cylindrical metal mold is used. A cylinder having a surface thereof flattened by copper plating or the like is rotated, and a predetermined groove-shaped recess pattern is formed in the cylinder by cutting with a diamond bit or the like. Next, a protrusion pattern is formed using the cylinder in a manner similar to printing. That is, a photocurable resin is filled in the groove-shaped recess of the cylinder, and a protrusion pattern formed of the photocurable resin is transferred onto a surface of a transparent sheet while rotating the cylinder. Further, the protrusion pattern is cured by irradiation with ultraviolet light. This system has the advantages that even when the thickness of the transparent sheet member is made as thin as several μm, a good protrusion pattern shape can be obtained, and that both the production of a metal mold and the production of a prism sheet can be performed at a low cost.

To the formation of the light-absorbing member 12, there can be applied the hitherto known technique for making a black matrix (BM) for a color filter. The light-absorbing member 12 may be made of any material as long as the material can absorb light, and examples of the material that can be used include a black resin, various paints, a metal oxide film, and a dielectric material. Incidentally, the light-absorbing member 12 also has a function of preventing color mixing of the EL lights 13 emitted from the adjacent light-emitting pixel portions 14.

An example of a method of disposing the prism member 11 and the light-absorbing member 12 will be described below.

FIGS. 1A and 1B show an example in which the light-absorbing member 12 is disposed adjacent to the prism member 11. However, the light-absorbing member 12 may be disposed on the surface of the prism member 11 by mask patterning (see FIG. 3A). Alternatively, the light-absorbing member 12 may be overlaid on the prism member 11 such that a flat surface is formed on the light extraction side (see FIG. 3B), or the prism member 11 is formed of a material that blackens by irradiation with ultraviolet light, and the member is turned into an uneven material capable of absorbing light by mask patterning (see FIG. 3C). Further, the prism member 11 may be disposed after the light-absorbing member 12 has been disposed by mask patterning (see FIG. 3D).

Next, an example of a method of producing an organic light-emitting apparatus by combining the prism member 11, the light-absorbing member 12, and the organic light-emitting device 10 made as described above will be described.

First, the organic light-emitting device 10 and the prism member 11 are stuck to each other, and then the light-absorbing member 12 can be disposed at a location corresponding to the non-light-emitting portion 15 of the organic light-emitting device 10 by mask patterning. Alternatively, the light-absorbing member 12 is disposed on the prism member 11 by mask patterning, and then the organic light-emitting device 10 and the prism member 11 are stuck to each other with an alignment such that the light-absorbing member 12 corresponds to the non-light-emitting portion 15 of the organic light-emitting device 10.

The circularly polarizing member 29 shown in FIG. 4 is obtained by stacking a polarizing member (linearly polarizing member) and a phase difference member.

The polarizing member is a filter that extracts linearly polarized light vibrating only in a given direction from lights vibrating in all directions. For example, a product obtained by a process in which a dichromatic dye such as iodine is adsorbed to a polyvinyl alcohol film and then the film is stretched to be uniaxially oriented can be used as the polarizing member.

The phase difference member provides a phase difference for light brought into a polarized state by the polarizing member. In the present invention, the member provides a phase difference of substantially $1/4\lambda$ and serves to change the polarized state, that is, change linearly polarized light to circularly polarized light, and change circularly polarized light to linearly polarized light. As the material for the phase difference member, for example, a uniaxially stretched orientation film of polycarbonate can be used.

Ambient light that transmits through a circularly polarizing member is converted into circularly polarized light. Further, circularly polarized light that transmits through a circularly polarizing member is converted into linearly polarized light when transmitting through the phase difference member. Circularly polarized light which has once transmitted through the circularly polarizing member and reflected by an anode electrode or the like is converted into polarized light in a direction perpendicular to the polarizing member when transmitting through the circularly polarizing member again and is therefore absorbed by the polarizing member and cannot transmit through the polarizing member.

As the material for the transparent substrate 28, a transparent material such as glass or a polycarbonate-based material can be used.

Further, in another embodiment of the present invention, the phase difference member may be disposed between an organic light-emitting device and a prism member, and the polarizing member may be disposed on the transparent substrate (not shown).

Here, in order to estimate the light extraction efficiency for EL emission light and the amount of reflection of ambient light in a system of a configuration according to the present invention, analysis was performed using a commercially available ray tracing simulation software. The conditions for ray tracing simulation were set as shown below.

(1) Setting of Emission Light

EL emission light: Perfectly diffusive light emission from central plane of light-emitting layer;

Number of rays: 2,000, Monte Carlo simulation;

Number of Fresnel branches: 50

(2) Setting of Ambient Light

Incidence angle: 45°, substantially parallel lights having diffused light cone angle of 2 to 4°;

Number of rays: 10,000, Monte Carlo simulation;

Number of Fresnel branches: 50

(3) Setting of Parameters of Configuration System

Anode electrode: Perfect reflection;

Light-emitting layer: Refractive index 1.70, Film thickness 0.13 µm;

Cathode electrode: ITO, Refractive index 2.00, Film thickness 0.05 µm;

Protective layer: Refractive index 1.53, Film thickness 50.0 µm;

Uneven member: Prism or pyramid, Refractive index 1.53, Apex angle 30° to 120°, Pitch 20 µm, End surface Fresnel reflection;

Light-absorbing member: (When present) Perfect absorption, (When absent) Prism or pyramid sheet exposed;

Aperture ratio: 55% (area of light-emitting pixel portion/area of one pixel)

Circularly polarizing member: λ/4 phase plate, $n_o$=1.5908, $n_e$=1.5821 (refractive index anisotropy), d=16.0 µm;

Linearly polarizing member (plate): $n_O$=1.50, $n_e$=1.53, $i_o$=5× $10^{-4}$, $i_e$=0.9 (transmittance anisotropy), d=100.0 µm The light extraction efficiency was calculated by determining a ratio of the luminous flux of light passing through the uppermost surface (the protective layer 27 or the prism member 11) of the organic light-emitting device 10 to travel to the outside of the element to the luminous flux of the emitted light. A system formed only of the organic light-emitting device 10 free of the prism member 11 was defined as a flat system.

In addition, for the quantity of reflection of ambient light, a viewing angle characteristic of reflection characteristics at the time of incidence of ambient light was determining by a simulation and was represented as a regular reflection peak value (value at a viewing angle of −45°, arbitrary unit).

Table 1 shows the results of the simulation of the ambient light regular reflection peak value and the light extraction efficiency when the apex angle of the prism member was changed from 30° to 120°.

TABLE 1

| Apex angle (°) | Present/absent of light-absorbing member | Ambient light regular reflection peak value (arbitrary unit) | EL-light extraction efficiency (%) |
|---|---|---|---|
| 30 | Present | 570 | 28.9 |
|  | Absent | 1416 | 36.2 |
| 60 | Present | 568 | 31.6 |
|  | Absent | 1131 | 40.1 |
| 90 | Present | 2569 | 30.3 |
|  | Absent | 2583 | 41.1 |
| 120 | Present | 934 | 28.3 |
|  | Absent | 1575 | 39.7 |
| Flat system | Absent | 7028 | 21.0 |

It can be seen from the above results that the ambient light regular reflection peak value is significantly reduced at each of all the apex angles except the apex angle of 90° as compared to that of the flat system, and the light extraction efficiency increases at each of all the apex angles as compared to that of the flat system. In addition, it can also be seen that when compared in terms of presence/absence of the light-absorbing member, the light extraction efficiency is reduced in the presence of the light-absorbing member as compared to that in the absence of the light-absorbing member, but is of the order of about 30%, and the ambient light regular reflection peak value is reduced in the presence of the light-absorbing member as compared to that in the absence of the light-absorbing member.

Next, Table 2 shows the results of a simulation in the case where the prism member is of a pyramid shape (system), carried out similarly to that for the case where the prism member is of the prism shape (system).

TABLE 2

| Apex angle (°) | Present/absent of light-absorbing member | Ambient Light regular reflection peak value (arbitrary unit) | EL-light extraction efficiency (%) |
|---|---|---|---|
| 30 | Present | 246 | 29.3 |
|  | Absent | 531 | 42.1 |
| 60 | Present | 485 | 34.0 |
|  | Absent | 821 | 46.6 |
| 90 | Present | 846 | 32.8 |
|  | Absent | 714 | 46.1 |
| 120 | Present | 376 | 29.9 |
|  | Absent | 758 | 47.3 |
| Flat system | Absent | 7028 | 21.0 |

It can be seen from the results that also when the uneven member is of the pyramid system, the regular reflection peak can be reduced as compared to that in the case of the prism system except for the case where the apex angle is 90°.

Incidentally, in both the prism system and the pyramid system, even when the light-absorbing member is present, there is observed no reduction in the ambient light regular reflection peak only in the case where the apex angle is 90°. The reason is that the incident angle of ambient light is set to 45°, so that ambient light is incident substantially perpendicularly to the uneven surface.

In general, ambient light includes parallel light such as sunlight and diffused light such as room light, so that the assumed incident angle of ambient light varies within a wide range. Therefore, it can be said that the above example of incidence at a fixed incident angle of ambient light is a very rare phenomenon.

The above description has been made by taking as an example the case where the incident angle of ambient light was 45°. Next, the reflection behavior of ambient light was subjected to a ray tracing simulation while the incident angle was changed within the range of 15° to 80° and furthermore the apex angle of the prism member was changed within the range of 30° to 160°. It has been seen from the results of the simulation that multiple reflection in the prism member is liable to occur when the apex angle of the prism member was more than 0° and 90° or less. As a result, ambient light is effectively absorbed by the light-absorbing member, or is reflected in various directions to reduce the amount of regularly reflected light. Accordingly, the apex angle of the prism member is preferably more than 0° and 90° or less.

The above consideration and simulation show that by using the prism member such as of a prism system or a pyramid system and the light-absorbing member, the improvement of extraction efficiency of EL emission light and the reduction in reflection of ambient light can simultaneously be realized.

The configuration examples of the organic light-emitting apparatus of the present invention have been described above. However, the present invention is not limited to the above configurations, and can take various forms.

For example, with regard to electrodes used in the present invention, an electrode which is closer to a substrate need not necessarily be an anode, and may be a cathode. In addition, the present invention is applicable not only to the so-called top emission type configuration in which light is extracted from a side opposite to a substrate side but also to the so-called bottom emission type configuration in which light is extracted from a substrate side. In addition, the organic light-emitting apparatus of the present invention may either be an active matrix type organic light-emitting apparatus or a passive matrix type organic light-emitting apparatus. The active matrix type organic light-emitting apparatus is of such a structure that thin film transistors for driving respective organic light-emitting devices are formed on a substrate, and light emission is controlled with the thin film transistors. The passive matrix type organic light-emitting apparatus is of such a structure that organic light-emitting devices are formed at intersections of stripe-shaped electrodes.

Further, the organic light-emitting apparatus of the present invention can be utilized as a display apparatus which can realize full color display by adopting a configuration including light-emitting devices of three colors, i.e., a red-light-emitting device, a green-light-emitting device, and a blue-light-emitting device. When the organic light-emitting apparatus is used as a display apparatus, the organic light-emitting apparatus can be preferably used in a television receiver, a personal computer (PC) monitor, a display portion of a mobile phone, a rear side display portion of an imaging apparatus (camera), a display portion of a personal digital assistant, or a display portion of a portable music player.

EXAMPLES

Example 1

An example of the organic light-emitting apparatus according to the present invention will be described in association with production steps.

First, a pyramid pattern sheet (prism member 11) having an apex angle of 60°, a pitch of 20 μm, and a height of 17 μm was formed of polycarbonate (refractive index: 1.53).

Next, a two-layer chromium black matrix (CrOx/Cr) (having a reflectance of 2% at 550 nm) composed of a chromium oxide film and a chromium film as the light-absorbing member 12 was formed by patterning on the pyramid sheet so as to have an aperture ratio of 55%.

Figure 3A:
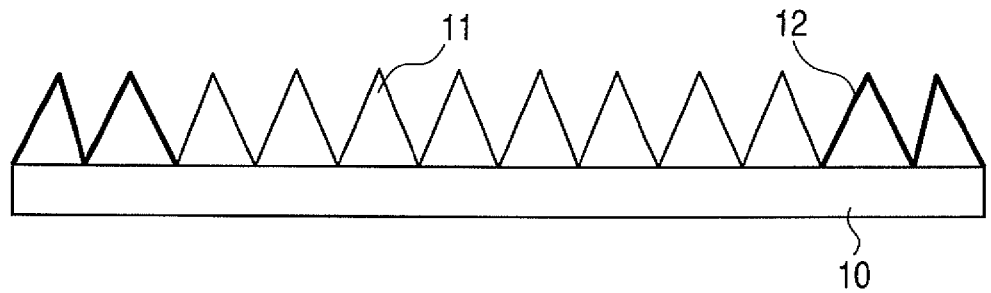
FIGS. 3A, 3B, 3C, and 3D are schematic views each illustrating an example of a manner in which a light-absorbing member is disposed.
Figure 3B:
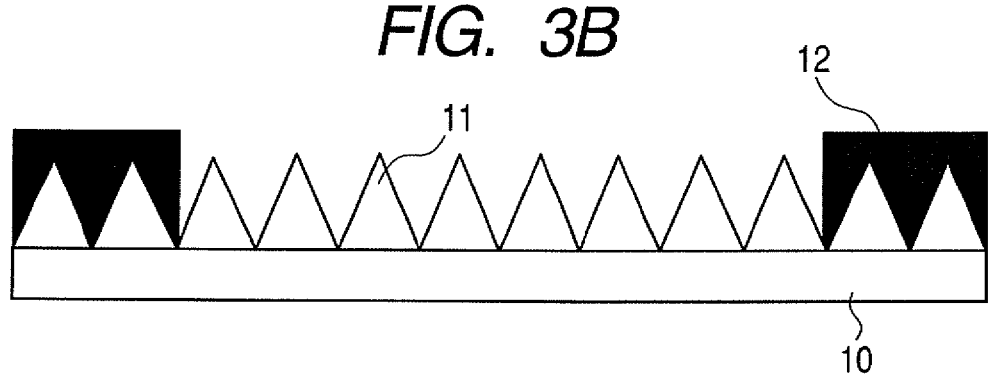
Figure 3C:
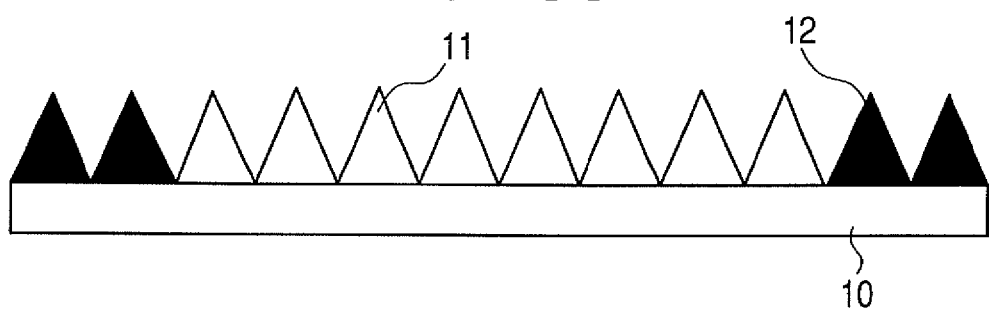
Figure 3D:
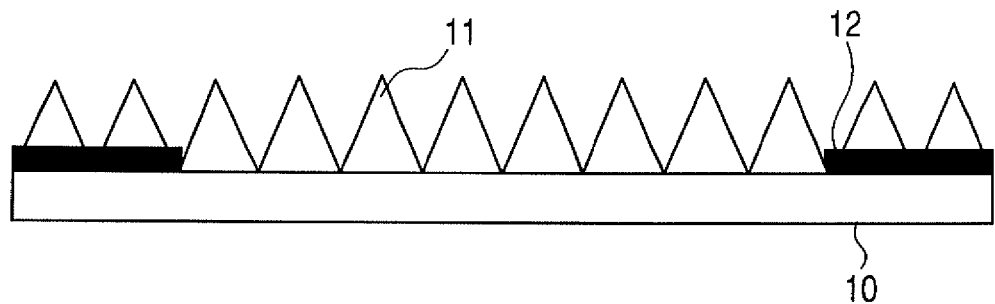

Further, the organic light-emitting device 10 having the configuration shown in FIG. 2 and the above prism member 11 were adhered to each other, whereby an organic light-emitting apparatus having the configuration shown in FIG. 3A was completed. At this time, the light-absorbing member 12 was disposed at a location corresponding to the non-light-emitting portion 15 of the organic light-emitting device 10 as shown in FIGS. 1A and 1B.

Comparative Example 1

An organic light-emitting apparatus of Comparative Example 1 has the same configuration as that of Example 1 described above with the exception that only an organic light-emitting device 10 having a flat light extraction surface is produced so as to have a flat configuration.

Comparative Example 2

An organic light-emitting apparatus of Comparative Example 2 has the same configuration as that of Example 1 described above with the exception that a circularly polarizing plate RD-HL56-WO3 (trade name; manufactured by SANRITZ CORPORATION; thickness: 100 μm) is adhered to the light extraction surface of the organic light-emitting device 10.

Example 2

An organic light-emitting apparatus of this example had exactly the same configuration as that of Example 1 with the exception that the aperture ratio was set to 79%.

Comparative Example 3

An organic light-emitting apparatus of Comparative Example 3 has the same configuration as that of Example 2 described above with the exception that only an organic light-emitting device 10 having a flat light extraction surface is produced so as to have a flat configuration.

Example 3

In this example, an organic light-emitting apparatus of the configuration shown in FIG. 4 was produced. A circularly polarizing plate RD-HL56-WO3 (trade name; manufactured by SANRITZ CORPORATION; thickness: 100 μm) adhered to a glass substrate was disposed on the organic light-emitting apparatus produced in Example 1 with a gap between the glass substrate and the apparatus.

Table 3 collectively shows the values of ambient light reflectance, EL emission luminance, and EL-light extraction efficiency.

TABLE 3

| System | | Aperture ratio (%) | Ambient light reflectance (%) | EL front luminance (cd/m$^2$) | EL-light extraction efficiency (%) |
|---|---|---|---|---|---|
| Ex. 1 | Pyramid system | 55 | 2.8 | 186 | 34.2 |
| Comp. Ex. 1 | Flat system | 55 | 33.9 | 118 | 19.8 |
| Comp. Ex. 2 | Flat system + circularly polarizing plate | 55 | 6.5 | 50 | 8.3 |
| Ex. 2 | Pyramid system | 79 | 3.7 | 198 | 36.7 |
| Comp. Ex. 3 | Flat system | 79 | 33.9 | 110 | 19.8 |
| Ex. 3 | Pyramid system + Circularly polarizing plate | 55 | 0.9 | 65 | 12.0 |

Here, for the ambient light reflectance, a regular reflectance at a viewing angle of −45° at the time of the incidence of ambient light (xenon lamp) at an incident angle of 45° was measured by use of a Gonio-Spectrophotometric Color Measurement System GCMS-1 (trade name; manufactured by MURAKAMI COLOR RESEARCH LABORATORY CO., Ltd.).

For the luminance of EL emission light, front luminance was actually measured with a luminance meter.

The extraction efficiency of EL emission light was calculated based on the above-mentioned simulation.

The above results of Examples show that with the organic light-emitting apparatus of the present invention, the ambient light reflectance can be reduced significantly as compared to that of the flat system. Further, the above results show that the reflectance of the present apparatus is smaller than that of the "flat+circularly polarizing plate" system.

In addition, the values of the EL front luminance and the light extraction efficiency of the present apparatus were increased as compared to those of the flat system.

In particular, as shown in Example 2, results substantially identical to those described above were obtained even when the opening ratio was increased. Further, as shown in Example 3, the apparatus of the present invention was superior to that of Comparative Example 2 in EL front luminance and light extraction efficiency, and showed an ambient light reflectance of less than 1%.

Example 4

An organic light-emitting apparatus of this example had the same configuration as that of Example 1 described above with the exception that the organic light-emitting device 10 and the prism member 11 were adhered to each other and the light-absorbing member 12 was aligned with and adhered to a location corresponding to the non-light-emitting portion 15.

The values of the ambient light reflectance, EL front luminance, and EL-light extraction efficiency of the apparatus were at substantially the same level as those of Example 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-260133, filed Sep. 26, 2006, and No. 2007-218190, filed Aug. 24, 2007, which are hereby incorporated by reference herein in their entirety.

What is claimed is:

1. An organic light-emitting apparatus comprising:
   a plurality of organic light-emitting devices each comprising a pair of electrodes and an organic compound layer formed between the pair of electrodes;
   a prism member disposed on a light extraction side of the organic light-emitting device, an interface on the light extraction side of the prism member being an interface with air; and
   a light-absorbing member formed between the plurality of organic light-emitting devices, around the prism member, and on a side portion of a protrusion of the prism member.

2. The organic light-emitting apparatus according to claim 1, wherein the plurality of organic light-emitting devices each has a protective layer on the light extraction side, and the protective layer and the prism member are in contact with each other.

3. The organic light-emitting apparatus according to claim 1, further comprising a circularly polarizing member on the light extraction side of the prism member.

4. The organic light-emitting apparatus according to claim 1, wherein the prism member has an apex angle of more than 0° and 90° or less.

5. The organic light-emitting apparatus according to claim 1, which is a display device, wherein the plurality of organic light-emitting devices include a red-light-emitting element, a green-light-emitting element, and a blue-light-emitting element.

6. The organic light-emitting apparatus according to claim 1, further comprising a protective layer on the light extraction side of the plurality of organic light-emitting devices 7. An organic light-emitting apparatus comprising:
   a plurality of organic light-emitting devices each comprising a pair of electrodes and an organic compound layer formed between the pair of electrodes;
   a prism member disposed on a light extraction side of the organic light-emitting device, an interface on the light extraction side of the prism member being an interface with air; and
   a light-absorbing member formed between the plurality of organic light-emitting devices and at a location corresponding to a non-light-emitting pixel portion of the organic light-emitting device.

8. The organic light-emitting apparatus according to claim 7, further comprising a protective layer on the light extraction side of the plurality of organic light-emitting devices.

9. The organic light-emitting apparatus according to claim 7, further comprising a circularly polarizing member on the light extraction side of the prism member.

10. The organic light-emitting apparatus according to claim 7, wherein the prism member has an apex angle of more than 0° and 90° or less.

11. The organic light-emitting apparatus according to claim 10, which is a display device, wherein the plurality of organic light-emitting devices include a red-light-emitting element, a green-light-emitting element, and a blue-light-emitting element.

12. An organic light-emitting apparatus comprising:
a plurality of organic light-emitting devices each comprising a pair of electrodes and an organic compound layer formed between the pair of electrodes;
a prism member disposed on a light extraction side of the organic light-emitting device, an interface on the light extraction side of the prism member being an interface with air; and
a light-absorbing member formed between the plurality of organic light-emitting devices and around the prism member disposed at a location correspond to a light-emitting pixel portion of the organic light-emitting device.

* * * * *